(12) United States Patent
Dutartre et al.

(10) Patent No.: US 8,975,154 B2
(45) Date of Patent: Mar. 10, 2015

(54) PROCESS FOR PRODUCING AT LEAST ONE DEEP TRENCH ISOLATION

(71) Applicant: STMicroelectronics (Crolles 2) SAS, Crolles (FR)

(72) Inventors: Didier Dutartre, Meylan (FR); Zahra Aitfqirali-Guerry, Saint Martin d'Heres (FR); Yves Campidelli, Le Moutaret (FR); Denis Pellissier-Tanon, Grenoble (FR)

(73) Assignees: STMicroelectronics SA, Montrouge (FR); STMicroelectronics (Crolles 2) SAS, Crolles (FR)

( * ) Notice: Subject to any disclaimer, the term of this patent is extended or adjusted under 35 U.S.C. 154(b) by 253 days.

(21) Appl. No.: 13/653,911

(22) Filed: Oct. 17, 2012

(65) Prior Publication Data
US 2013/0095636 A1    Apr. 18, 2013

(30) Foreign Application Priority Data
Oct. 18, 2011 (FR) .................................. 11 59404

(51) Int. Cl.
*H01L 21/76* (2006.01)
*H01L 21/762* (2006.01)

(52) U.S. Cl.
CPC .............................. *H01L 21/76237* (2013.01)
USPC .................... 438/433; 257/E21.546; 438/218; 438/221; 438/296; 438/400; 438/424; 438/437; 438/524

(58) Field of Classification Search
USPC .......... 257/E21.546; 438/218, 221, 296, 400, 438/404, 424, 433, 437, 524
See application file for complete search history.

(56) References Cited

U.S. PATENT DOCUMENTS

| | | | |
|---|---|---|---|
| 5,759,905 A * | 6/1998 | Pan et al. ...................... 438/565 |
| 5,801,082 A | 9/1998 | Tseng |
| 5,874,346 A | 2/1999 | Fulford et al. |
| 6,214,698 B1 | 4/2001 | Liaw et al. |
| 2004/0219769 A1 * | 11/2004 | Voldman et al. .............. 438/528 |
| 2008/0057612 A1 | 3/2008 | Doan et al. |
| 2008/0145994 A1 * | 6/2008 | Herner .......................... 438/380 |
| 2009/0267176 A1 | 10/2009 | Yang et al. |
| 2011/0006390 A1 * | 1/2011 | Huang et al. .................. 257/510 |

* cited by examiner

*Primary Examiner* — Asok K Sarkar
(74) *Attorney, Agent, or Firm* — Allen, Dyer, Doppelt, Milbrath & Gilchrist, P.A.

(57) ABSTRACT

A method for producing at least one deep trench isolation in a semiconductor substrate including silicon and having a front side may include forming at least one cavity in the semiconductor substrate from the front side. The method may include conformally depositing dopant atoms on walls of the cavity, and forming, in the vicinity of the walls of the cavity, a silicon region doped with the dopant atoms. The method may further include filling the cavity with a filler material to form the at least one deep trench isolation.

18 Claims, 3 Drawing Sheets

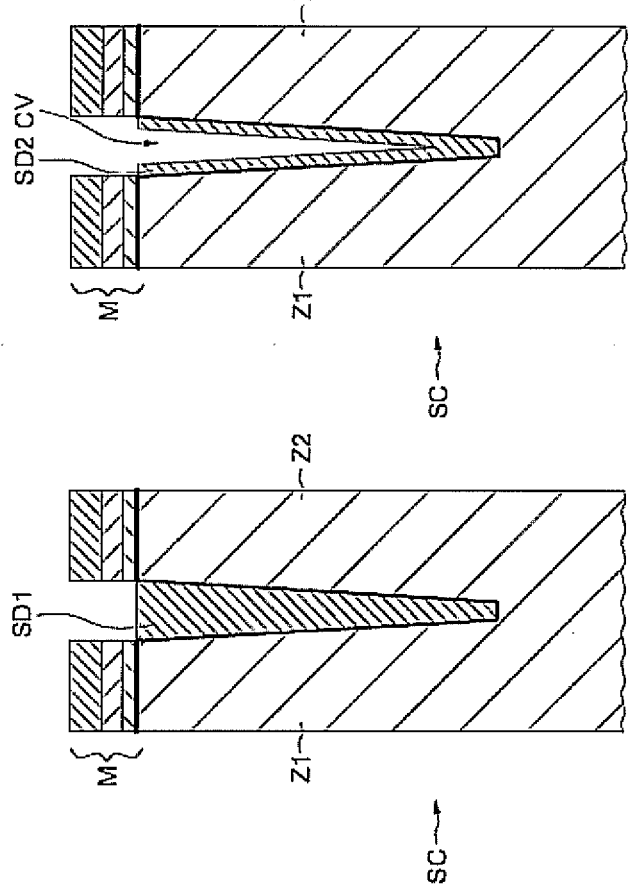

PROCESS FOR PRODUCING AT LEAST ONE DEEP TRENCH ISOLATION

FIELD OF THE INVENTION

The invention relates to integrated circuits and more particularly to deep trench isolation (DTI), for example, for bounding the photosensitive zones of pixels in integrated imaging devices.

BACKGROUND OF THE INVENTION

Integrated imaging devices generally comprise, in each pixel, a photosensitive zone comprising a semiconductor material in which free charge carriers are obtained when light passes through the photosensitive zone. These charge carriers are then collected for each pixel. It is therefore desirable to prevent the charge carriers obtained from passing from one photosensitive zone to another, or "cross-talk", as this effect is commonly referred to by those skilled in the art.

DTI trenches are generally used to bound pixels. In order to produce these trenches, dopant atoms may be implanted so as to bound the photosensitive zones, the dopant atoms creating a potential barrier between the photosensitive zones. This approach has the drawbacks of not optically isolating the pixels (leading to the appearance of optical cross-talk), of not sufficiently electrically isolating deep regions, of producing wide trenches, and of not allowing trenches with depths of greater than 2 microns, for example, to be obtained. During the fabrication of imaging devices in advanced technologies, it is advantageous to form thin trench isolation in order to increase the pixel density.

It has also been known to form cavities corresponding to the trenches, and then to implant dopant atoms at a number of angles of attack relative to the surface in which the cavities are formed. It is thus possible to implant dopant atoms in the vicinity of the cavity walls and to fill these cavities with an insulating material. Even though this technique makes optical isolation possible, inclined implantation has the drawback of not allowing sufficiently deep trench isolation to be formed since the walls at the bottom of the cavities are not being passivated effectively enough by the dopant atoms. Moreover, deep trench isolation produces defects in the crystal structure, which defects are liable to generate dark currents.

SUMMARY OF THE INVENTION

According to one implementation, deep trench isolation with a high aspect ratio is produced while limiting the drawbacks of the prior-art approaches mentioned above. According to one aspect, a method is provided for producing at least one deep trench isolation in a semiconductor substrate comprising silicon and having a front side. The method includes forming at least one cavity in the semiconductor substrate from the front side and conformally depositing dopant atoms on the walls of the cavity, for example, by depositing only dopant atoms or by depositing doped silicon. The method includes forming, in the vicinity of the walls of the cavity, a silicon region doped with the dopant atoms, and filling the cavity with a filler material, for example, an insulating material or doped silicon, to form at least one deep trench isolation.

It may be easier to produce a doped region in the vicinity of the walls of the cavities using a step of conformally depositing dopant atoms rather than by a number of implantation steps. It may also be possible, by adjusting the parameters of the deposition step, to form trench isolation with a higher aspect ratio.

The conformal deposition of dopant atoms may comprise chemical vapor deposition of dopant atoms. Thus, the parameters (species, pressure, temperature, etc.) of the chemical vapor deposition step may be adjusted to obtain a high-quality conformal deposition even at the bottom of the cavity. The wall of the at least one cavity may be cleaned before dopant atoms are conformally deposited.

Dopant atoms may be deposited and the doped silicon region may be formed in one and the same step, which step comprises depositing doped silicon. The gases used in the chemical vapor deposition step may comprise a silicon precursor gas and a precursor gas of the dopant atoms. The conformal deposition of dopant atoms may comprise forming a layer of doped silicon that does not fill the cavity.

As a variant, dopant atoms may be conformally deposited, and the cavity may be filled with a filler material in one and the same step, which step comprises depositing doped silicon. In another variant, the doped silicon region is formed by diffusing dopant atoms deposited on the walls of the cavity into the silicon of the substrate.

The filling of the cavity with a filler material may comprise depositing a dielectric material. Thus, a cavity comprising doped silicon in the vicinity of its walls is filled with an insulating material. Silicon dioxide ($SiO_2$) may, for example, be used, making electrical and optical isolation (obtained by the refractive index difference between the silicon and the silicon dioxide) possible.

Thus, a single deposition step is used to passivate the walls of the cavity and then fill the cavity. Because implantation steps are not used to produce a trench comprising doped silicon, this process especially may not damage the crystal structure of the silicon. The creation of defects in this structure, liable to lead to dark currents, is thus limited.

The conformal deposition of dopant atoms may furthermore comprise depositing carbon atoms. The carbon atoms may limit the diffusion of certain dopant atoms into the semiconductor substrate. The trench isolation may bound a photosensitive zone of a pixel of an imaging device.

BRIEF DESCRIPTION OF THE DRAWINGS

FIG. 2a is a schematic diagram of a portion of semiconductor substrate having a cavity filled with doped silicon made in accordance with an embodiment of the present invention.

FIG. 2b is a schematic diagram of a portion of semiconductor substrate having a doped-silicon layer on the walls of a cavity made in accordance with an embodiment of the present invention.

FIG. 2c is a schematic diagram of a portion of semiconductor substrate having dopant atoms deposited on the walls of the cavity in accordance with an embodiment of the present invention.

DETAILED DESCRIPTION OF THE PREFERRED EMBODIMENTS

Figure 1:
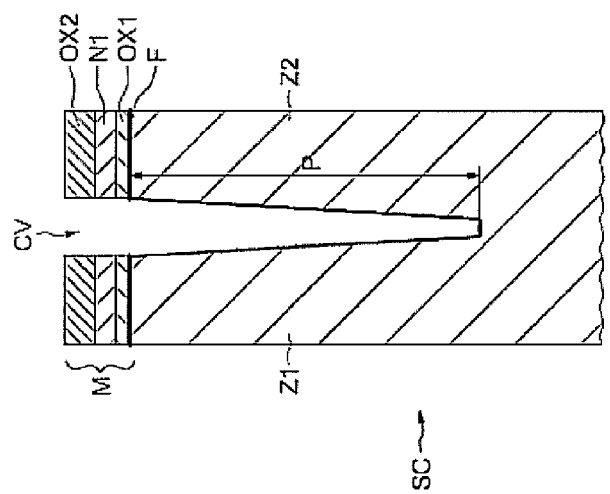
FIG. 1 is a schematic diagram of a portion of a semiconductor substrate made in accordance with an embodiment of the present invention.

FIG. 1 shows a portion of a semiconductor substrate SC comprising silicon. The semiconductor substrate SC may be a silicon substrate of a wafer comprising only silicon or else a silicon-on-insulator (SOI) wafer. In the case of an SOI wafer, the substrate SC may comprise a buried insulating region that has not been shown in FIG. 1. The substrate SC comprises a front side F, and two zones Z1 and Z2 of the substrate SC are intended to form the photosensitive zones of adjacent pixels.

To form a deep trench isolation separating the photosensitive zones Z1 and Z2, a cavity CV may be formed from the side F opening into the semiconductor substrate SC or into a buried insulating region of an SOI wafer. This cavity may be formed by ion etching of a hard mask M possibly having been formed beforehand on the front side F of the substrate SC. Here, the hard mask M comprises multiple layers, for example, a first silicon-dioxide layer OX1, a silicon-nitride ($Si_3N_4$) layer NI, and a second silicon-dioxide layer OX2. The cavity CV may be about several microns, for example, 5 or 6 microns, in depth and have a width of about a hundred nanometers. In the case of an SOI wafer, the depth p of the cavity is chosen to obtain a cavity that opens into the buried insulating region. Next, a step may be implemented for cleaning the wall of the cavity CV, for example, using an SC1 (standard clean 1) procedure, which is well known to those skilled in the art, followed by cleaning with hydrofluoric acid (HF).

FIG. 2a shows an embodiment in which the cavity CV is completely filled with doped silicon SD1. The deposition step may be a conformal deposition of doped silicon with a sufficient thickness to fill the cavity, for example, about 50 to 100 nanometers. The photosensitive zones Z1 and Z2 generally comprise weakly doped silicon, i.e. n-type or p-type silicon to use terminology well known to those skilled in the art. The doped silicon SD1 is $p^+$-doped silicon, i.e., the doped silicon is more highly doped than the silicon of the zones Z1 and Z2. The dopant atoms in the doped silicon SD1 may, for example, comprise boron. By way of indication, the dopant concentration in the zones Z1 and Z2 is, for example, about $1 \times 10^{15}$ atoms per cubic centimeter, and the concentration of dopants in the region SD1 is, for example, about $1 \times 10^{19}$ atoms per cubic centimeter.

By way of non-limiting example, chemical vapor deposition employing silicon precursor gases (silane ($SiH_4$), dichlorosilane ($SiH_2Cl_2$), etc.), and boron precursor gases ($B_2H_6$) at a temperature ranging from 550 degrees Celsius up to 800 degrees Celsius may be implemented. Conformal deposition of doped silicon is thus obtained.

An anneal may also be carried out at a temperature of about 850 degrees Celsius in hydrogen gas ($H_2$), thereby allowing possible imperfections in the crystal structure of the substrate SC to be repaired, especially imperfections due to the step used to form the cavity. It may also be possible to modify the parameters of the chemical vapor deposition step to obtain what is called selective deposition, i.e. in which deposition only occurs on silicon and not on the other materials, the mask M materials, for example. Specifically, $SiH_2Cl_2$, at a pressure of about 50 millitorr, may be used as the silicon precursor gas, $B_2H_6$ may be used, at a pressure of about one microtorr, as the boron precursor gas, and hydrogen gas may be used at a pressure of about 20 torr, the temperature being about 750 degrees Celsius. These parameters enable conformal and selective deposition of doped silicon to be obtained.

It is also possible to deposit a thickness of doped silicon that does not fill the cavity CV. Thus, as illustrated in FIG. 2b, a doped-silicon layer SD2, for example, about 10 nanometers in thickness, may be conformally formed on the walls of the cavity CV, which may not be completely filled by the doped silicon SD2. The chemical vapor deposition parameters given above also allow the doped-silicon layer SD2 to be obtained.

FIG. 2c shows another embodiment in which only dopant atoms are deposited on the walls of the cavity. This technique is generally referred to as vapor phase doping by those skilled in the art. Such deposition may be carried out by a chemical vapor deposition step using a boron precursor and a mixture, comprising a silicon precursor and hydrogen chloride (HCl), able to etch any silicon deposited, leaving only dopant atoms behind.

By way of non-limiting example, chemical vapor deposition may be used. The deposition may be carried out at a temperature of about 850 degrees Celsius using dichlorosilane ($SiH_2Cl_2$) at a pressure of about 40 millitorr as the silicon precursor, hydrogen chloride at a pressure of about 100 millitorr, and $B_2H_5$ at a pressure of about 5 microtorr as the boron precursor. Conformal deposition of dopant atoms is thus obtained without silicon being deposited.

It is also possible not to use a silicon precursor gas and hydrogen chloride and to use only a boron precursor gas. In this case, the deposition is carried out at a lower temperature, for example, below 650 degrees Celsius.

Next, as illustrated in FIG. 2c, the deposited dopant atoms diffuse into the silicon of the substrate SC through the wall of the cavity CV and thus dope the region SD3 located in the vicinity of the cavity. Next, the unfilled cavities CV may be filled with a filler material, and the mask M may be removed (FIGS. 3a, 3b, and 3c).

Figure 3C:
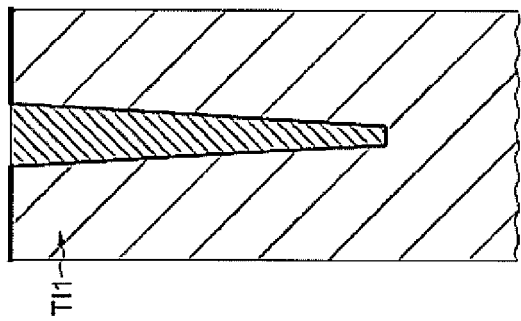
FIG. 3c is a schematic diagram of a portion of the semiconductor substrate of FIG. 2c having the cavity filled with silicon dioxide and with the mask removed.
Figure 3B:
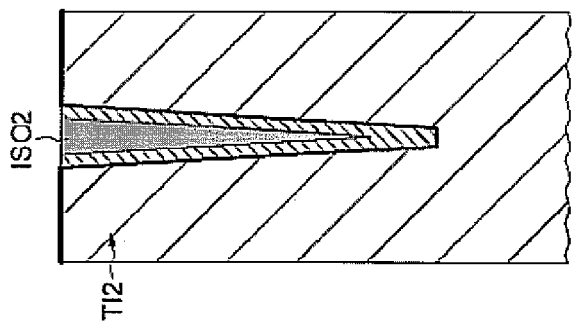
FIG. 3b is a schematic diagram of a portion of the semiconductor substrate of FIG. 2b having the cavity filled with silicon dioxide and with the mask removed.
Figure 3A:
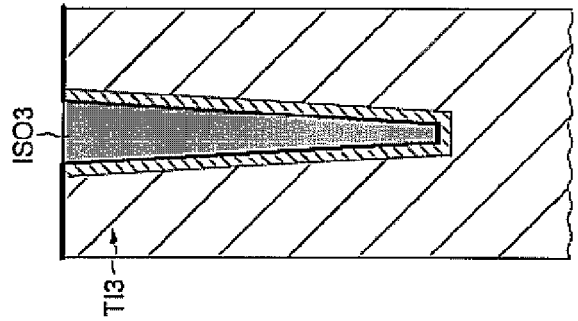
FIG. 3a is a schematic diagram of a portion of the semiconductor substrate of FIG. 2a with the mask removed.

The cavity in FIG. 3a has already been completely filled with doped silicon. It is therefore not desirable to fill the cavity with an insulating material. Thus, trench isolation TI1 comprising doped silicon is obtained without implantation steps. This trench isolation TI1 has a depth that may reach 8 microns, for example. The depth may depend on the intended application, in particular, on the wavelength of the light to be detected, on the lateral dimension of the pixel, on the lateral dimension of the trench isolation, and on the etching parameters.

Furthermore, a carbon precursor may be used in the dopant-atom deposition steps described above. The carbon introduced may dope the doped-silicon regions, for example, SD1, SD2 or SD3, with a dopant level, for example, between 0.1% and 1%. The carbon introduced allows diffusion of certain dopant atoms, for example, boron atoms, into the silicon of the substrate SC during anneals carried out after the deposition step to be reduced. For this purpose, a carbon precursor, such as, monomethylsilane may be used at a pressure below that used for the silicon precursor (for example, one hundred times lower in the case of silane or one thousand times lower in the case of dichlorosilane).

The cavities of FIGS. 3b and 3c may be filled with silicon dioxide ISO2 and ISO3 to obtain trench isolation, TI2 and TI3, respectively. This trench isolation TI2 and TI3 comprises doped silicon in the vicinity of its wall and an insulating material partially encapsulated in the doped silicon. It will be noted that there may be additional diffusion of the deposited dopant atoms into the silicon of the semiconductor substrate SC after the cavities have been filled, for example, subsequent to annealing steps carried out after the deposition step.

According to one aspect, a dopant profile is obtained which is more stable as a function of depth, i.e. a dopant profile which is more conformal than that obtained by implantation or by inclined implantation in a cavity, and the trench is passivated even at the bottom of this trench. In this way, electrical or optical cross-talk and dark currents are limited, and it is possible to produce deeper trench isolation.

That which is claimed:

1. A method of making at least one deep trench isolation in a semiconductor substrate comprising silicon and having a front side, the method comprising:
    forming at least one cavity in the semiconductor substrate from the front side;
    conformally depositing dopant atoms on walls of the at least one cavity by forming a layer of doped silicon that does not fill the at least one cavity;
    forming, adjacent the walls of the at least one cavity, a doped silicon region doped with the dopant atoms; and
    filling the at least one cavity with a filler material by depositing a dielectric material to form the at least one deep trench isolation.

2. The method according to claim 1, wherein the conformal deposition of dopant atoms comprises a chemical vapor deposition of dopant atoms.

3. The method according to claim 1, further comprising cleaning the walls of the at least one cavity before conformally depositing dopant atoms.

4. The method according to claim 1, wherein the doped silicon region is formed while conformally depositing the doped silicon.

5. The method according to claim 1, wherein the at least one cavity is filled with the filler material while depositing the doped silicon.

6. The method according to claim 1, wherein forming the doped silicon region comprises diffusing dopant atoms deposited on the walls of the at least one cavity into the silicon of the substrate.

7. A method of making at least one deep trench isolation in a semiconductor substrate, the method comprising:
    forming at least one cavity in the semiconductor substrate;
    conformally depositing dopant atoms within the at least one cavity by forming a layer of doped silicon that does not fill the at least one cavity;
    forming, adjacent the at least one cavity, a doped semiconductor region doped with the dopant atoms; and
    filling the at least one cavity with a filler material by depositing a dielectric material to form the at least one deep trench isolation.

8. The method according to claim 7, wherein the conformal deposition of dopant atoms comprises a chemical vapor deposition of dopant atoms.

9. The method according to claim 7, further comprising cleaning the walls of the at least one cavity before conformally depositing dopant atoms.

10. The method according to claim 7, wherein the doped semiconductor region is formed while conformally depositing the doped silicon.

11. The method according to claim 7, wherein the at least one cavity is filled with the filler material while depositing the doped silicon.

12. The method according to claim 7, wherein forming the doped semiconductor region comprises diffusing dopant atoms deposited on the walls of the at least one cavity into the semiconductor substrate.

13. A method of bounding a photosensitive zone of a pixel of an integrated imaging device comprising a semiconductor substrate comprising silicon and having a front side, the method comprising:
    forming at least one cavity in the semiconductor substrate from the front side;
    conformally depositing dopant atoms on walls of the at least one cavity by forming a layer of doped silicon that does not fill the at least one cavity;
    forming, adjacent the walls of the at least one cavity, a doped silicon region doped with the dopant atoms; and
    filling the at least one cavity with a filler material to bound the photosensitive zone by depositing a dielectric material.

14. The method according to claim 13, wherein the conformal deposition of dopant atoms comprises a chemical vapor deposition of dopant atoms.

15. The method according to claim 13, further comprising cleaning the walls of the at least one cavity before conformally depositing dopant atoms.

16. The method according to claim 13, wherein the doped silicon region is formed while conformally depositing the doped silicon.

17. The method according to claim 13, wherein the at least one cavity is filled with a filler material while depositing the doped silicon.

18. The method according to claim 13, wherein forming the doped silicon region comprises diffusing dopant atoms deposited on the walls of the at least one cavity into the silicon of the substrate.

* * * * *